(12) United States Patent
Scholte Von Mast et al.

(10) Patent No.: US 9,252,037 B2
(45) Date of Patent: Feb. 2, 2016

(54) VACUUM TREATMENT APPARATUS AND A METHOD FOR MANUFACTURING

(75) Inventors: Bart Scholte Von Mast, Azmoos (CH); Wolfgang Rietzler, Bludenz (AT); Rogier Lodder, Bad Ragaz (CH); Rolf Bazlen, Rorschach (CH); Daniel Rohrer, Mels (CH)

(73) Assignee: Oerlikon Advanced Technologies AG, Balzers (LI)

( * ) Notice: Subject to any disclaimer, the term of this patent is extended or adjusted under 35 U.S.C. 154(b) by 49 days.

(21) Appl. No.: 13/997,801

(22) PCT Filed: Dec. 27, 2011

(86) PCT No.: PCT/EP2011/074094
§ 371 (c)(1),
(2), (4) Date: Jun. 25, 2013

(87) PCT Pub. No.: WO2012/089732
PCT Pub. Date: Jul. 5, 2012

(65) Prior Publication Data
US 2013/0287527 A1 Oct. 31, 2013

Related U.S. Application Data

(60) Provisional application No. 61/427,861, filed on Dec. 29, 2010.

(51) Int. Cl.
*H01L 21/677* (2006.01)
*H01L 21/67* (2006.01)

(52) U.S. Cl.
CPC ...... *H01L 21/67739* (2013.01); *H01L 21/6719* (2013.01); *H01L 21/6776* (2013.01); *H01L 21/67703* (2013.01); *H01L 21/67748* (2013.01); *H01L 21/67751* (2013.01)

(58) Field of Classification Search
CPC .................. H01L 21/6719; H01L 21/67751
USPC .......................................................... 414/217
See application file for complete search history.

(56) References Cited

U.S. PATENT DOCUMENTS 4,969,790 A * 11/1990 Petz et al. ................ 414/217
6,149,367 A * 11/2000 Begin ................... 414/331.18
(Continued)

FOREIGN PATENT DOCUMENTS

WO WO 2010/105967 9/2010

OTHER PUBLICATIONS

Written Opinion of the International Searching Authority of International Application No. PCT/EP2011/074094.

*Primary Examiner* — Saul Rodriguez
*Assistant Examiner* — Mark Hageman
(74) *Attorney, Agent, or Firm* — Notaro, Michalos & Zaccaria P.C.

(57) ABSTRACT

A vacuum treatment apparatus and method for manufacturing has a plurality of treatment chambers for treating workpieces, in particular silicon wafers, a transfer chamber attached to the treatment chambers communicating via respective openings and having handling zones located adjacent to each of the treatment chambers. A workpiece carrier is arranged within the transfer chamber and configured to transfer the workpieces between the handling zones, and one or more handlers for moving the workpieces between the handling zones and the treatment chambers. The transfer chamber is ring-shaped about an axis and the openings have opening substantially parallel thereto. This way, forces on the transfer chamber are redirected to a large support structure and thus, a cost-effective, light and still rigid mechanical construction can be achieved.

21 Claims, 6 Drawing Sheets

(56) References Cited

U.S. PATENT DOCUMENTS

| | | | |
|---|---|---|---|
| 7,021,776 B2* | 4/2006 | Nagae | 359/507 |
| 7,066,703 B2* | 6/2006 | Johnson | 414/217 |
| 7,534,080 B2* | 5/2009 | Guo et al. | 414/217 |
| 7,763,115 B2* | 7/2010 | Hatanaka et al. | 118/719 |
| 7,828,900 B2* | 11/2010 | Hatanaka et al. | 118/719 |
| 8,562,271 B2* | 10/2013 | Hofmeister et al. | 414/217 |
| 2005/0232726 A1* | 10/2005 | Murrell | 414/217 |
| 2010/0054905 A1* | 3/2010 | Behdjat et al. | 414/805 |

* cited by examiner

PRIOR ART

PRIOR ART

VACUUM TREATMENT APPARATUS AND A METHOD FOR MANUFACTURING

TECHNICAL FIELD OF THE INVENTION

The present invention is related to a vacuum treatment apparatus and a method for manufacturing.

BACKGROUND OF THE INVENTION

Such a vacuum treatment apparatus is e.g. used in thin film solar cells production or in the field of semiconductor production. For example WO 2010/105967 A2 shows an apparatus that is used for treating silicon wafers, which are used as a base for solar cells. The apparatus comprises different treatment chambers or stations for treating the substrates, for example for sputtering, etching or heating. For transferring the substrates between these treatment chambers, the apparatus comprises a circular transfer chamber, called vacuum treatment recipient that comprises individual handling zones located adjacent to each of the treatment chambers. In operation, a rotating carrier, called transport arrangement, transfers the substrates between the different handling zones and in a further step, substrate handlers move the substrates between the handling zones and the adjacent treatment chambers.

SUMMARY OF THE INVENTION

The present invention has the objective to propose an improved vacuum treatment apparatus and a method for manufacturing.

This objective is reached by a vacuum treatment apparatus comprising the features specified in claim 1. Further embodiments of the vacuum treatment apparatus as well as a method for manufacturing are specified in the further claims.

The invention proposes a vacuum treatment apparatus comprising:
- a plurality of treatment chambers for treating workpieces, in particular silicon wafers,
- a transfer chamber being attached to the treatment chambers communicating via respective openings with the transfer chamber and comprising handling zones located adjacent to each of the treatment chambers,
- a workpiece carrier arranged within the transfer chamber configured to transfer the workpieces between the handling zones, and
- one or more handlers for moving the workpieces between the handling zones and the treatment chambers.

Thereby the transfer chamber is ring-shaped about an axis and the openings have opening axes substantially parallel to said axis. This allows redirecting forces on the transfer chamber to large support structures, in particular to the inner side wall of the ring-shaped transfer chamber. Thus, a cost-effective, light and still rigid mechanical construction can be achieved.

Under the term "ring-shape" or "ring", throughout this description also called "torus-shaped" or "torus", a substantially flat body is understood that comprises a through hole. Thereby the through hole provides an open space in and along this ring.

In the context of a transfer chamber the term "ring-shape" refers to the internal space or enclosure of such a ring. Thus, the transfer chamber is confined by a first annulus-shaped wall adjacent to the through hole, a second annulus-shaped wall opposing the first annulus-shaped wall, an outer side wall formed by the peripheral edge of the ring, and an inner side wall formed by the through hole. If such a transfer chamber is positioned horizontally, the upward oriented annulus-shaped wall is the top wall and the downward oriented annulus-shaped wall is the bottom wall. Further, the height of the ring is the distance between the annulus-shaped walls and the radial width is the distance between the inner and outer side walls. The through hole provides an open space, in this description also called omitted space, which can be used as installation space, for example as a passage for pipes, or as space for assisting service and maintenance. Without limiting this definition, an example of such a ring-shaped transfer chamber is schematically shown in FIG. 6b and explained in the corresponding description.

In particular, at least one of the following applies to the ring-shaped transfer chamber:
- the annulus-shaped walls are parallel,
- the open space or omitted space is arranged in the center of the transfer chamber,
- at least one of the annulus-shaped walls or both are circular,
- at least one of the side walls or both are cylindrical,
- at least one of the side walls or both are perpendicular to at least one of annulus-shaped walls,
- at least one of the side walls defines an axis of symmetry,
- the inner and outer side walls have a common axis of symmetry,
- the inner and outer side walls are concentric
- the shape is equal or similar to a washer.

An example of such a ring-shaped transfer chamber is schematically shown in FIG. 6b and explained in the corresponding description.

Throughout this description, the transfer chamber is also called transfer vacuum chamber, main vacuum chamber or transport chamber and the treatment chamber is also called process chamber, process station, treatment station or simply station. Further, an interface chamber, for example a locker such as an input chamber or exit chamber, as well as an intermediate chamber is also regarded as a treatment chamber.

The "workpiece", also called "substrate", is a body of solid material that is to be treated, e.g. coated, etched or heated. In one example, the workpiece is disc-shaped or wafer-shaped having at least one substantially plane surface, in particular two opposing substantially plane surfaces. Further, if the workpieces are transferred in the transfer chamber by a rotational movement, their path defines a plane, which is called a "transfer plane". The rotatable workpiece carrier is also called a carousel and the handler is also called a chuck. In addition, the handler is also called a "workpiece lift" and the corresponding movement of the workpiece is called "lifting". Thus, the term "lift" may or may not mean that the position of the transfer chamber is horizontal.

Advantageously, the ring-shaped structure according to the invention redirects the forces exerted on the transfer chamber to a large support structure. Thus, a cost optimized, light and still rigid mechanical construction can be achieved. This is particular advantageous in the case, that one or more treatment chambers are opened to the transfer chamber and the full collapsing force of the vacuum from inside the treatment chambers is exerted on the transfer chamber.

Further, the ring-shape transfer chamber according to the invention provides for a reduced internal space of the transfer chamber, i.e. a considerable lower volume, because the open space in the middle of the ring is not part of the transfer chamber. This enables fast transition to the required process conditions, in particular a fast lowering or rising of pressure or temperature. This in turn provides for fast processing cycles and for an efficient operation management. Further, the omitted central space can be used for installing supply lines, pumps or directing gas or electric lines through this space.

In addition, the ring-shape transfer chamber according to the invention provides lengthening of the path between non-adjacent treatment chambers. Thus, enhanced source isolation and/or a minimization of cross contamination can be achieved, because the path from one treatment chamber to another non-adjacent one is longer and more convoluted then in circular transfer chamber. In particular short-cuts via the middle part are avoided. This is particularly advantageous if the workpiece carrier is mounted at the inner wall of the ring-shape transfer chamber, because in this case the path along the inner side wall is blocked by the workpiece carrier and only the path along the outer side wall is available for gas flows.

In a further embodiment of the vacuum treatment apparatus according to the invention, surrounds an open space and/or has a substantially rectangular cross-section of at least the inner space of extending in radial direction.

In a further embodiment of the vacuum treatment apparatus according to the invention, the radial width of the inner space of the ring-shaped transfer chamber is equal or larger than the height of the inner space.

In a further embodiment of the vacuum treatment apparatus according to the invention, the workpiece carrier comprises a controllably rotatable ring plate or segmented assembly about said axis and in an inner space of the transfer chamber, the area of the radial cross section of the workpiece carrier being more than 70% of the area of radial the cross section of the inner space of the transfer chamber. This limits vacuum conductivity.

In a further embodiment of the vacuum treatment apparatus according to the invention, the radial inner and outer side walls of the ring-shaped transfer chamber have an inner radius and outer radius respectively and the length of the inner radius is at least 25% or at least 50% of the outer radius.

In a further embodiment of the vacuum treatment apparatus according to the invention, the ring-shaped transfer chamber is arranged horizontally. This enables to use gravitational forces to assist the handling of the workpieces, in particular their fixation, and thus provides for efficient and precise operation.

In a further embodiment of the vacuum treatment apparatus according to the invention, the workpiece carrier comprises a ring plate about said axis, rotatable and held single or both sided by bearings arranged at the radial inner side wall and/or at the radial outer side wall of the ring-shaped transfer chamber. This way, a robust and precise holding and/or guiding of the workpiece carrier is achieved.

In one example, ball bearings, in particular with ceramic balls, or magnetic bearings are used. In another example, the movement of the workpiece carrier, in particular its rotary motion, is accomplished by a gear rim and gears and/or by a friction clutch and/or magnetically.

The drive mechanism to move the workpiece carrier around it axis may be an electric motor (e.g. stepper motor) or a hydraulic motor. In a further example the motor acts directly or via a gear mechanism on said gear rim. In a preferred realization of said example the motor simultaneously acts on two separate gears engaging in said gear rim. The two gears, preferably of the same dimension, are braced against each other e.g. by means of springs. This way the drive of the workpiece carrier can be accomplished free of backlash. The workpiece carrier may exhibit position control means, such as an indexer, light barriers or other sensors to determine the absolute position or relative movement of the workpiece carrier. This sensor means can be advantageously be connected with the motor control to allow for precise positioning and moving the workpiece carrier.

In a further embodiment of the vacuum treatment apparatus according to the invention, the surface of an inner wall of at least one of the treatment chambers substantially aligns to the surface of the outer side wall and/or to the surface of the inner side wall of the ring-shaped transfer chamber considered in a plane parallel to and including said axis. Thus, the treatment chambers are adjacent to the outer rim and/or inner rim of the ring-shaped transfer chamber. This way a vacuum enclosure is achieved with minimized upper and lower load bearing surfaces.

In a further embodiment of the vacuum treatment apparatus according to the invention, one or more parts of the treatment chambers, for example a wall of the housing or a pump, are arranged very close to the side walls of the ring-shaped transfer chamber. If these parts are build of high strength materials, this arrangement fully relaxes the mechanical requirements to the transfer vacuum chamber.

In a further embodiment of the vacuum treatment apparatus according to the invention, one or more, in particular all, of the treatment chambers are attached to a particular wall of the ring-shaped transfer chamber, in particular to a first annulus-shaped wall, a second annulus-shaped wall, an inner side wall or an outer side wall.

In a further embodiment of the vacuum treatment apparatus according to the invention, two or more, in particular all, of the treatment chambers are distributed between opposing walls of the ring-shaped transfer chamber, in particular between annulus-shaped walls and/or between an inner side wall and an outer side wall.

In a further embodiment of the vacuum treatment apparatus according to the invention, at least two of the treatment chambers are opposing each other.

In a further embodiment according to the invention, the workpiece carrier is configured to move workpieces having at least one substantially plane surface in a direction parallel to the substantially plane surface and perpendicularly to said axis between positions adjacent to the openings in the handling zones and further comprising workpiece lifts operative in the handling zones configured to move the workpieces in the handling zones from the workpiece carrier towards the openings and inversely. This is particular efficient and reliable for a ring-shaped transfer chamber, because the workpiece is always kept the same direction during the transfer.

In a further embodiment of the vacuum treatment apparatus according to the invention, the workpiece carrier is configured to hold substantially plane workpieces in a position parallel to the transfer path of the workpieces. With this configuration a particular effective use of the available ring-shaped space is achieved.

In a further embodiment of the vacuum treatment apparatus according to the invention, the workpiece carrier matches the shape of the transfer chamber. Thus, the space used in the transfer chamber is efficiently used. In one example, the workpiece carrier, in particular its inner border or its bearing, has a shape of a flat ring or washer-design.

In a further embodiment of the vacuum treatment apparatus according to the invention, at least one of the treatment chambers is accessible from the adjacent handling zone via the opening that comprises a seal arrangement establishing a sealing action controllably by operation of a workpiece lift provided in the handling zone and configured to controllably lift a workpiece from the workpiece carrier towards the opening or inversely, the seal arrangement separating the inside of the transfer chamber from the inside of the treatment chamber. This provides a lighter mechanical structure and increased flexibility for operating the vacuum treatment apparatus.

In a further embodiment of the vacuum treatment apparatus according to the previous embodiment, the sealing action is enforced by a pressure difference directed from the treatment chamber to the transfer chamber.

In a further embodiment of the vacuum treatment apparatus according to the invention, the at least one of the treatment chambers comprises a first part configured to perform treatment of the workpieces and a second part configured to establish vacuum conditions, in particular for providing connectivity to a vacuum pump, wherein, one of the first and second parts being arranged on one side of the workpiece carrier, the other of the parts opposite to the one part and on the other side of the workpiece carrier, the two parts being in flow communication at least when a workpiece is in treatment position with respect to the first part.

In a further embodiment of the vacuum treatment apparatus according to the invention, the transfer chamber comprises at least one cryogenic plate arranged between neighboring handling zones. This arrangement is particular advantageous in combination with the ring-shape of the transfer chamber, because the gas flow in the transfer chamber is forced to pass the cryogenic plate, thus short-cuts via a center part are avoided. In addition, the ring-shape provides for a narrow channel and therefore very efficient cryogenic isolation can be achieved.

In a further embodiment of the vacuum treatment apparatus according to the invention, the transfer chamber comprises at least one position sensor arranged between the handling zones for position detection of the workpiece carrier and/or the workpieces. In one example, the sensor serves as an indexer to determine the relative or absolute position, in particular the angular position, of the workpiece carrier and/or the workpieces.

In a further embodiment of the vacuum treatment apparatus according to the invention, the transfer chamber comprises at least one gas pump for establishing a low gas pressure in the transfer chamber. In one example, this pump additionally assists to establish a low gas pressure in one or in all of the treatment chambers.

In a further embodiment according to the invention, the vacuum treatment apparatus comprises an arrangement of hollow pipes that is a supporting structure for the transfer chamber and that additionally serves for transporting gas or liquid that is to be pumped out of or into the transfer chamber and/or the treatment chambers.

Further, the invention proposes a method for operating a vacuum treatment apparatus with a plurality of treatment chambers, a ring-shaped transfer chamber being attached to the treatment chambers and comprising a handling zone adjacent to each treatment chamber, a workpiece carrier and one or more handlers, the method comprising the steps of:

using one substrate handler for moving a workpiece, in particular a silicon wafer, between one of the treatment chambers to a to a first of the handling zones;

driving the workpiece carrier to transfer the workpiece from the first handling zone to a second handling zone being adjacent to a further treatment chamber; and using the one or a further substrate handler for moving the workpiece form the second handling zones to the further treatment chamber.

Further, the invention proposes a method for manufacturing a workpiece, which is treated by a vacuum treatment, comprising:

a. providing a workpiece transfer chamber which is ring shaped about an axis;

b. providing a plurality of treatment chambers (18,19), communicating by respective openings with the workpiece transfer chamber via respective openings with opening axes substantially parallel to said axis;

c. providing a ring shaped workpiece carrier in the ring shaped transfer chamber;

d. providing adjacent at least one of the openings a workpiece lift;

e. depositing a workpiece on the ring shaped workpiece carrier in the transfer chamber;

f. moving the workpiece carrier with the workpiece in a position where the workpiece is aligned with the one opening;

g. lifting the workpiece by the workpiece lift towards the one opening;

h. vacuum treating the workpiece by the treatment chamber;

i. retracting the treated workpiece on the workpiece carrier;

j. moving the workpiece carrier with the workpiece in a position where the workpiece is aligned with a further of the treatment chambers;

k. repeating steps h. to j. up to the workpiece having been treated by predetermined ones of the treatment chambers;

l. removing the treated workpiece from the workpiece carrier.

In a further embodiment of the previous method embodiment, the method further comprises providing a pumping facility to at least one of the treatment chambers and evacuating the transfer chamber at least predominantly by the pumping ability.

In a further embodiment of the previous method embodiments, the method further comprises further sealingly separating the treatment chamber from the transfer chamber at least during step h.

It is expressly pointed out that any combination of the above-mentioned embodiments, or combinations of combinations, is subject to a further combination. In particular the embodiments of the ventilation element are also embodiments of the ventilation assembly. Only those combinations are excluded that would result in a contradiction.

BRIEF DESCRIPTION OF THE DRAWINGS

Below, the present invention is described in more detail by means of exemplary embodiments and the included simplified drawings. It is shown in.

BRIEF DESCRIPTION OF THE INVENTION

The described embodiments are meant as illustrating examples and shall not confine the invention.

DEFINITIONS AND ACRONYMS

Throughout the description and the claims the following definitions and acronyms are used:

Processing includes any chemical, physical or mechanical effect acting on substrates and changing its surface properties.

Transferring a substrate means any acting on a substrate like moving, transporting, storing, which is not covered by the definition of processing.

Measuring a substrate means inspecting, detecting or otherwise determining the status or changes of the properties of a substrate.

Treating a substrate (treatment) includes processing, transferring and measuring.

Substrates in the sense of this invention are components, parts or workpieces to be treated in a processing apparatus. Substrates include but are not limited to flat, plate shaped parts having rectangular, square or circular shape. Substrate materials include semiconductors, glass, metal, plastic or alike. In a preferred embodiment this invention addresses essentially planar, disk shaped substrates of a size about 650 $cm^2$, such as silicon wafers of 30 cm diameter or smaller diameter. This example shall not be limiting.

Figure 10:
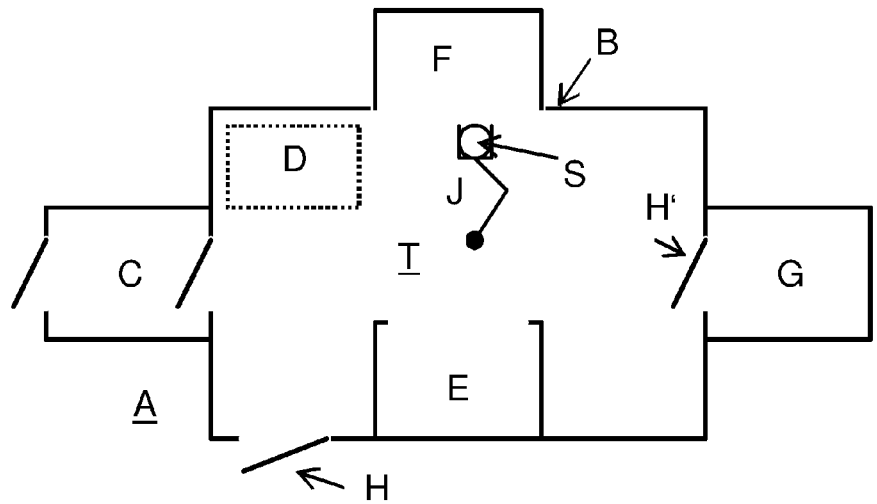
FIG. 10 is a schematic of a vacuum processing system.

With a view on FIG. 10, showing simplified schematics of a vacuum processing system, a processing or vacuum processing or vacuum treatment system or—apparatus A comprises at least an outer enclosure B for accommodating substrates to be treated under pressures lower than ambient atmospheric pressure. Access to said enclosure may be realized via a Load Lock C, valve or a door-like device H. Processing within said vacuum processing system may be limited to certain areas D or partial volumes E, F, G within said enclosure, also denoted as process station, process chamber or treatment station. Said process chambers may exhibit devices H' allowing for the temporary separation of said process stations from the residual vacuum treatment system's volume. The vacuum system A may exhibit a handling system J for moving substrate(s) S between process stations D, E, F, G, the Load Lock C and or the ambient via closable access opening H. Areas and/or volumes within said vacuum system A, where no processing takes place is sometimes called transfer chamber or transport area/volume T.

Chemical vapor deposition (CVD) is a well known technology allowing the deposition of layers on heated substrates. A usually liquid or gaseous precursor material is being fed to a process system where a thermal reaction of said precursor results in deposition of said layer.

Physical vapor deposition (PVD) is a technology of vacuum deposition and is a general term used to describe any of a variety of methods to deposit thin films by the condensation of a vaporized form of the material onto various surfaces (e.g., onto semiconductor wafers). Variants of PVD include (not terminal listing) Cathodic Arc Deposition, Evaporative deposition, Sputter deposition. The terms layer, coating, deposit and film are interchangeably used for a film deposited in vacuum processing equipment, be it CVD, LPCVD, plasma enhanced CVD (PECVD) or PVD.

BACKGROUND

The present invention integrates and combines solutions to specific requirements apparent in a progressing semiconductor processing market. Some of these requirements are aimed at increasing the profitability of tool deployment. Others are directed at maintaining or improving the technical capabilities of the equipment to at least sustain but possibly create a technological advantage.

In order for a piece of equipment to be attractive for a producer of semiconductor devices or services, said equipment must show clear commercial benefits. Clear benefits are a low initial investment and high productivity. In addition, low production loss rates must we warranted (high reliability and yield).

For the design of the equipment, this consequently means that the following factors must be addressed;
  Low build cost to obtain a minimal initial investment
  High throughput to output the maximum number of product per time interval
  Safe material handling to minimize the loss of product during the production cycle Technological Requirements Key to the reliable processing of semiconductor devices is control of the processing environment. In deposition tools or, more general, vacuum treatment systems for workpieces, there are two aspects which notably impact this:
1. Very high base vacuum levels
2. High available pumps speeds during processing
3. Absence of any uncontrolled material exchanges between process stations, so a high level of source isolating capabilities.

The term deposition tools or treatment system generally refers to tools or systems adapted or designed to treat substrates, such as disk shaped workpieces (wafers, disks from glass, semiconductors, metal or alike) under conditions of reduced atmospheric pressure and/or vacuum. Treatment in this respect may include depositing of layer(s), etching, exposing to neutral or ionized particles (e.g. ion-bombarding), cooling, heating, handling or a combination of such treatments.

Prior Art Concept

Figure 1:
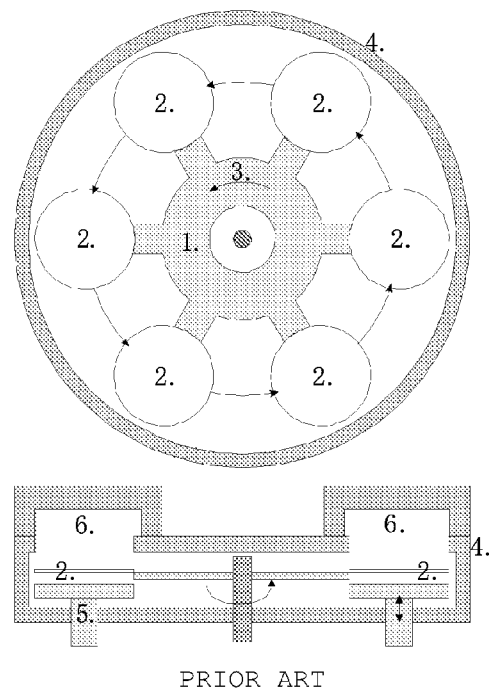
FIG. 1 a top and side view of a revolving material transport in an indexer type tool or treatment system.

FIG. 1 shows a revolving material transport in an indexer type tool or treatment system. PCT Publication WO 2010/105967 shows a vacuum treatment system with a carousel 1 supporting substrate carriers or substrates 2. This fixed arrangement of substrates on said carousel 1 allows for simultaneous movement of substrates 2. The carousel as shown in FIG. 1 performs a stepwise rotation 3 in a handling chamber or outer enclosure 4. Treatments stations 6 are fixedly arranged in said outer enclosure, such that by turning the carousel the substrates can be aligned with the position of the treatment stations 6 as shown. Once the carousel is in position, or indexed, substrate handling devices 5 are moved through the rotation plane of the carousel to pick up the substrates 2 out of the carousel and move the substrates into the treatment station 6 (also named process chamber) while simultaneously sealing of the process chamber to the transfer chamber.

The sealing of the process chamber can be done with a vertically moving chuck or by adding a material carrier which acts as a seal between the outer enclosure 4 and the treatment station 6.

In the process chamber, the substrates are then kept in position by gravity or by clamps, weight rings or comparably equivalent fixation means.

The fact that all substrates are moved at the same time guarantees the highest possible effectiveness of substrate transport between chambers, thereby resulting in a high throughput of substrates through the equipment. In addition, the very simple movement trajectory of the substrate from one process chamber to the next significantly reduces the risk of transport errors and substrate loss while the accelerating forces on the substrates are minimized. This allows for very safe handling of substrates.

Conceptual Shortcomings of Prior Art

Figure 2:
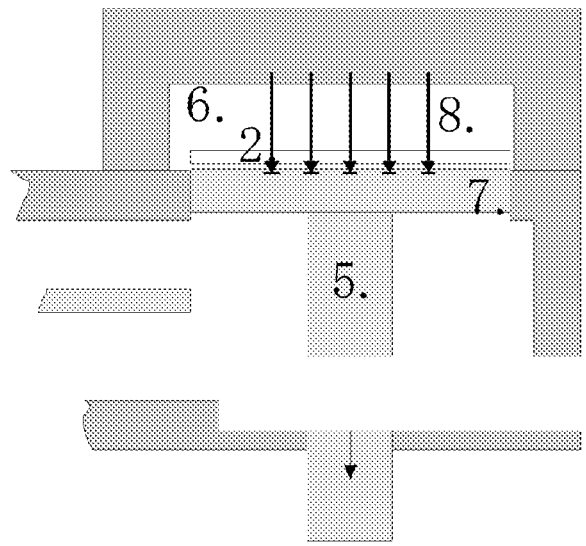
FIG. 2 a process chamber section.

FIG. 2 shows a process chamber section. Almost all indexer type tools seal at least partially process chamber(s) 6 from the transfer chamber 4 by closing or covering the process chamber with a valve, lid, cover or solid plate, preferably parallel to the carousel plane. This describes a relatively simple way of insulating the chambers, but especially at larger substrate sizes, these sealing plates become very large (and heavy) which results in very high forces 8 on the mechanical construction under various vacuum conditions. Especially when the process chamber 6 is vented and the transfer chamber 4 remains under vacuum, these forces get very high. Unfortunately, this situation is quite common. For process chambers this occurs with any maintenance intervention. For an airlock the forces are exerted with every wafer transfer.

The fact that the process chamber is sealed off by a solid plate favorably yields a chamber with a relatively small volume. However, it also leads to the unfortunate situation that the large process chamber pump, which is required to assure the vacuum performance of the chamber during operation, may be larger than the dimensions of the process chamber. In other words, the desired reduction of process chamber volume also reduces the ability to arrange the vacuum pump at an ideal position close to the volume to be addressed. Several methods have been devised to resolve this including connecting lines and channels or ring like arrangements for the gases, but all have the major shortcoming that the pumping speed is greatly reduced by the typical dimensions of the process chamber.

Indexer tools typically have a very large (in terms of volume) substrate transfer chamber. Even though during processing this chamber may be sealed from the processing gases, it is almost inevitable that residual species from one process chamber end up in another. The large transfer chamber does not provide any means to promote source isolation and to minimize cross contamination, other than a large high vacuum pump.

Figure 3:
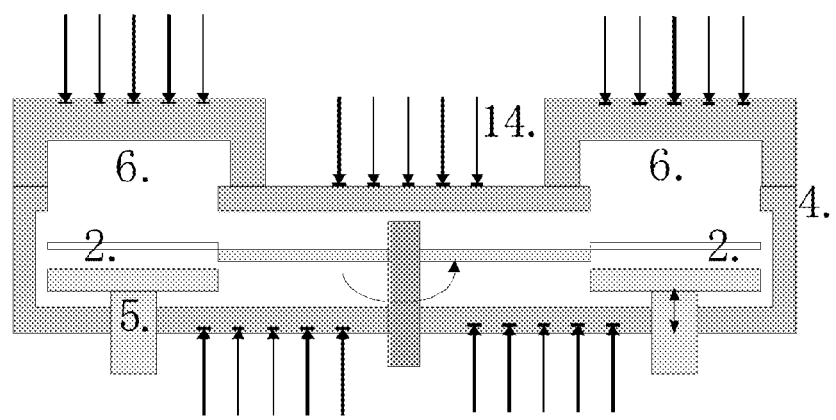
FIG. 3 a planar transfer chamber with a open and a closed treatment chamber.

FIG. 3 shows a planar transfer chamber. The vacuum transfer chamber required for the carousel creates a problem in itself because very large substrates and or many substrates arranged on such a star-like arrangement require very large carousels, leading to large, flat vacuum enclosures 4. Vacuum forces 14 as shown in FIG. 3 exerted on such chambers are so high that very strong chambers must be made to keep the chamber deformation within acceptable limits. This need to reinforce the chambers results in increased manufacturing cost.

In single substrate handling and treatment equipment like the well known cluster tool concept, it is feasible to measure the position of the substrate with respect to the equipment features as shown in U.S. Pat. No. 7,706,908. However, in indexer tools, the accurate measurement of actual substrate positions is more complex while several positions must be determined simultaneously. Most indexer tools therefore have no means to evaluate the substrate position and state once the substrate is loaded into the transfer chamber.

In summary, the following conceptual shortcomings can be identified for indexer type equipment;

Horizontal chamber seals resulting in very elaborate and costly mechanics to deal with the resulting vacuum forces.

Small, flat processing chamber providing no ports for large vacuum pumps compromising pump speeds and vacuum performance.

Large, flat transfer chambers which have to withstand enormous forces but still need to provide very accurate shapes. These chambers are heavy, costly and difficult to make.

No means to minimize cross contamination

No means to monitor wafer handling states.

The present invention aims at overcoming all the shortcomings described by a new concept for a vacuum treatment tool.

DETAILED DESCRIPTION OF THE INVENTION

Through Transfer Plane Process Chamber

As shown in FIG. 2, closing (and sealing) the process chamber with a flat plate creates a favorable relatively flat process chamber. However, pumping this chamber is greatly hindered by this geometry: The pump needs to be connected operatively with that process chamber via a pump line with a preferably large cross section. Attaching such pump line effectively without unduly enlarging the process chamber volume and/or creating an inhomogeneous flow is mechanically challenging. Also, closing of the chamber with a flat plate results in a costly mechanical construction due to the forces involved.

Figure 4:
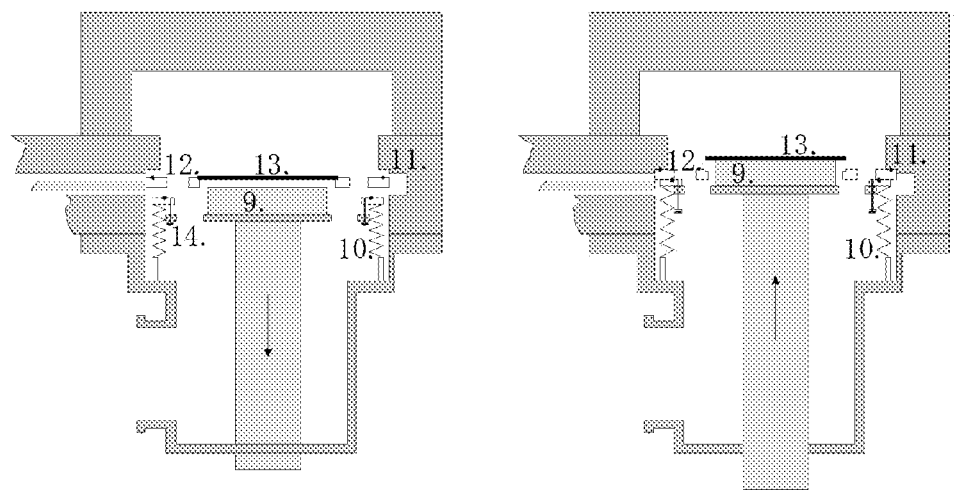
FIG. 4 a through transfer plane process chamber.

Both engineering difficulties can be resolved by intentionally arranging the pump in a plane beyond the effective process chamber, thus enlarging the volume to be pumped during operation. The resulting chamber is shown in FIG. 4, showing a through transfer plane process chamber. Key identifiers of this chamber design are;

An upward moving chuck 9 pushes a bellow 10 through the transfer plane against a sealing surface 11 to create a closed, vertical chamber.

The sealing plate is replaced by a perforated plate 12, the carrier ring, which carries material 13 and the sealing ring. The upward moving chuck picks the material out of the sealing plate.

The upward motion of the bellow picks the carrier ring or sealing ring out of the carousel and pushes it against the sealing surface of the upper process chamber.

The downward motion of the chuck places the carrier ring back into the carousel, the wafer back in the carrier ring and pulls the below out of the wafer transfer plane 14.

This concept resolves some of the outlined shortcomings by;

Establishing a large vacuum chamber with ample room to directly connect very large pumps with appropriate pumping openings and conductance. In FIG. 4 the pump connection is shown as the large opening on the bottom left, but could be arranged equivalently, too.

The process chamber is sealed with the bellows, thereby redirecting all vacuum and pressure resulting forces to radially balanced forces instead of unbalanced opening forces. This allows for much lighter mechanical systems.

Summary:

A vacuum process system for the treatment of substrates comprising at least one process chamber and a transfer chamber and means for removing gases from said process system (pumping means) and means for sealing said process chamber at least temporarily from said transfer chamber, wherein, during transfer of a substrate the pumping means are being operatively connected to both the transfer chamber and the process chamber while during processing the pumping means are operatively connected solely to the process chamber volume.

The invention can also be understood and described as follows: With reference to FIG. 4 a substrate is located during transfer in a transfer plane (substrate 13 in FIG. 4, left) and is being moved (e.g. lifted) by chuck 9 in a process position which shall define a process plane. A sealing plane is being defined by the sealing surface 11 (=contact plane of bellow 10 with process chamber). Chuck 9 accepts substrate 13 in the transfer plane and moves it (e.g. upwards) through the sealing plane to the process plane. Thus the process chamber volume penetrates the sealing and the transfer plane and thus includes volumes located on both sides of said planes. In contrast, Prior Art process chamber volume according to FIG. 2 is located on just one side of the sealing plane or transfer plane respectively. This allows attaching a vacuum pump on the side averted from the sealing and transfer plane and establishing a generous pumping cross section. Moreover, thus vacuum pumps from all process volumes will affect the transfer chamber volume during transfer. Please note, that by this inventive arrangement the flow of gases during transfer of substrates is averted from the process chamber volumes. In Prior Art with the vacuum pumps arranged close to the effective volume, the gases (and potentially dust and debris) have been attracted into the process chambers.

Inverted Vacuum Chamber Sealing

The process chamber sealing method described above is advantageous to seal the process chamber because no forces are apparent which drive to open the chamber when the process chamber pressure is higher than the transfer chamber pressure. This aspect of the sealing mechanism can be enhanced so that the vacuum forces are inverted with respect to the original situation. This means, the design is made such that the vacuum forces drive to close the process chamber when its pressure is higher than the transfer chamber pressure.

The inversion of these forces is realized by reducing the diameter of the sealing O-ring which seals the moveable part of the bellows to a size smaller then the outer diameter of the bellows.

Figure 5:
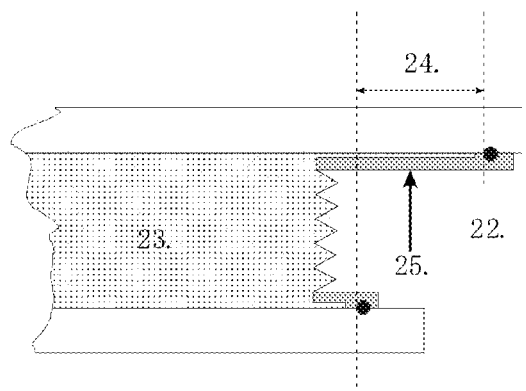
FIG. 5 an inverted vacuum seal.

This arrangement is shown in FIG. 5, showing an inverted vacuum seal. When no pressure difference between the transfer and process chamber exists, no forces are exerted on the seal. When the pressure inside the process chamber 22 is higher than in the transfer chamber 23, the area 25 created by arranging the sealing O-ring more inwards by the distance indicated as 24, will be exposed to the pressure difference.

Due to the arrangement, a force results from the pressure difference exerted on 25 which will drive to close the process chamber. As a result, the sealing mechanics and overall mechanical construction can be made much lighter. It has to be noted, however, that when the transfer chamber is vented while the process chamber is under vacuum, the situation reverses and the pressure difference will open the process chamber.

This concept resolves some of the outlined shortcomings by;
  Establishing a situation where the process chamber or airlock closes itself when it is at higher pressures than the transfer chamber, resulting in simpler and lighter construction and thereby reducing complexity and cost.

Summary:

A vacuum processing system for the treatment of substrates comprising at least one process chamber and a transfer chamber and a bellow for sealing said process chamber at least temporarily from said transfer chamber, said bellow having a first and a second opening, wherein the diameter of said first opening is smaller than that of the second opening, said smaller first opening being fixedly surrounded by a flange or rigid collar, the flange or rigid collar exhibiting an area or plane arranged essentially in parallel to said opening.

A method for sealing a process chamber from a transfer chamber in a vacuum processing system, said process chamber having an opening connecting said process chamber with said transfer chamber ("process chamber opening"), further having a flex bellow with two openings, the diameter of the first opening being smaller than that of the second opening, said smaller first opening being fixedly surrounded by a flange or rigid collar with an area or plane arranged essentially in parallel to said opening. the second, larger opening being operatively connected to a pumping means; wherein the sealing step is being accomplished by operatively connecting the process chamber opening with the first opening of said flex bellow and establishing a pressure difference between the process chamber and the transfer chamber, the pressure in the process chamber being higher than in the transfer chamber during processing.

Torus Shaped Chamber

A transfer chamber according to prior art as described above experiences full vacuum forces when evacuated, regardless of the vacuum state in the process stations. Even though the closing forces of the bellows partially counter this effect, when the process chambers are opened, the full collapsing force of the vacuum inside the equipment is exerted on the transfer chamber.

There are several ways to counter this effect. The chamber could be made out of high strength material and/or of out of very thick material. Both methods will drive cost.

A different approach is to place support structures inside the chamber, connecting upper and lower load bearing plates. In the rotational arrangement of an indexer type tool, the only possible support structure is a central post. Still, this leaves a relatively large load bearing surface and requires a heavy construction.

Figure 6:
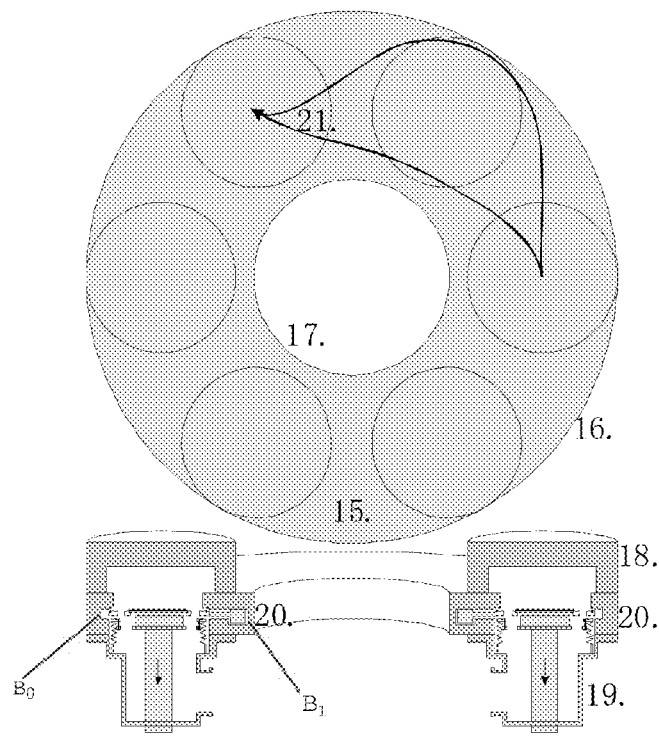
FIG. 6 a top and side view of a torus-shaped transfer chamber.

When pushing the latter approach to the limit, i.e. increasing the diameter of the central post, the support structure can be made as large as necessary. The natural limitation is the space necessary for the process stations which will be arranged adjacent to the outer rim of the disk-shaped transport chamber. This way a torus shaped vacuum enclosure can be achieved with minimized upper and lower load bearing surfaces as has indicated in FIG. 6, showing a torus-shaped transfer chamber. The inner radius of the torus shaped vacuum enclosure is approximately 41% of the outer radius of the torus shaped vacuum enclosure.

When making the torus design, the outer diameter 16 is kept as small as possible and the inner diameter 17 is kept as large as possible. This then allows the upper 18 and lower 19 process chamber parts to rest very close to the vertical walls 20 of the torus. Since these critical parts are usually made out of high strength materials, this arrangement then fully relaxes the mechanical requirements to the transfer vacuum chamber.

One other aspect which benefits of this arrangement is the source isolation or minimization of cross contamination. In the torus shaped vacuum chamber of the wafer transfer system, the path from one process station to another non-adjacent one 21 is longer and more convoluted then in single volume transfer chambers. This enhances source isolation.

Further, the overall volume of the transfer chamber is considerably lowered by omitting the central part of the transfer chamber. This space again can be used, outside the torus, to install supply lines, have pumps arranged, or directing gas or electric lines from the upper to the lower part of the system.

This concept resolves some of the outlined shortcomings by;
Redirecting the forces exerted on the main vacuum chamber to the largest possible support structures, a cost optimized, light and still rigid mechanical construction can be made.

By lengthening the path between non-adjacent process stations, cross contamination is minimized.

A substrate carrier will advantageously have a shape matching the torus shape, such as a flat ring or washer-design. This substrate carrying ring can be held single sided by devices arranged at the inner and/or outer vertical walls. Bearings like ball bearings or magnetic or even air (gas) bearings allow holding and guiding the substrate carrying ring, for example, a bearing $B_I$ at the inner vertical wall and/or a bearing $B_O$ at the outer vertical wall. The transfer movement (rotary motion) can be realized via a gear rim and gears, a friction clutch or again magnetically. An indexer may be arranged to determine the relative or absolute (angular) position of the ring and the substrates.

Figure 6B:
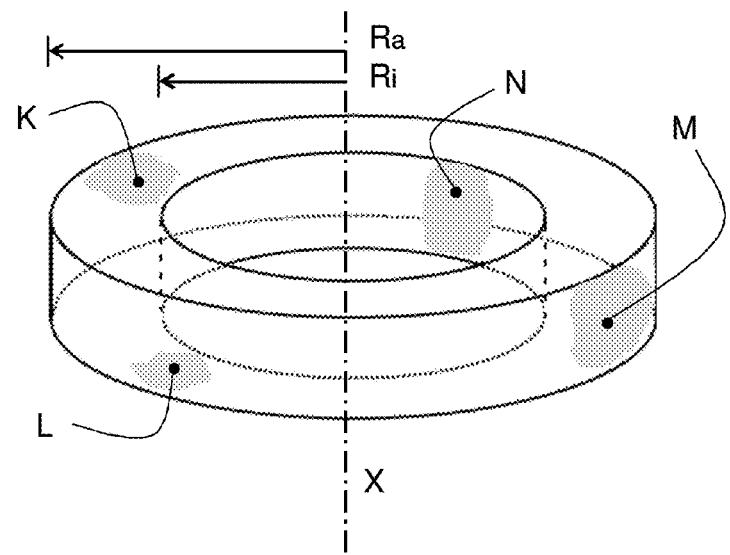
FIG. 6b schematics of the torus shaped vacuum chamber.

FIG. 6b shows schematics of the torus shaped vacuum chamber. The ring-shape or torus-shaped is based on a horizontally arranged, substantially flat body that comprises a through hole in the center, which provides an open space in and along the ring. Thus, the ring surrounds an open space and the shape of the body is equal or similar to a washer.

The ring is hollow and comprises the vacuum chamber or transfer chamber as an internal space of the ring. Thus, the transfer chamber is confined by a top wall K providing a first annulus-shaped wall, a bottom wall L providing a second annulus-shaped wall, a radial outer side wall M formed by the peripheral edge of the ring, and a radial inner side wall N formed by the through hole. The top wall K as well as the bottom wall L is arranged adjacent to the through hole, opposing each other. The radial inner wall N as well as the radial outer side walls M is cylindrically-shaped and both are arranged concentric around as common axis X. The distance from common axis X to the radial inner side wall is the inner radius Ri and the distance from common axis X to the radial outer side wall is the outer radius Ra.

Further, the top wall K and the bottom wall L are parallel, each of the inner and outer side walls N,M is perpendicular to the top wall K as well as to the bottom wall L, each of the radial side walls N,M defines an axis of symmetry. Thus, the transfer chamber has a substantially rectangular cross-section extending in radial direction. Thereby the inner radius Ri is approximately 63% of the outer radius Ra.

Summary

A vacuum process system for the treatment of substrates comprising at least one process chamber and a transfer chamber and wherein, said transfer chamber has, in top view, a ring-shape, with an annulus shaped top wall (K) and bottom wall (L) and essentially circular, concentric inner (N) and outer (M) side walls establishing an enclosure, arranged around a common symmetry axis (X); the transfer of substrates taking place in a plane parallel to said top and bottom wall and perpendicularly to said symmetry axis (X) said process chamber being arranged adjacent to top wall (K), bottom wall (L), inner or outer side wall (N, M).

A vacuum process system where Ri is the distance (radius) of the inner side wall (N) to symmetry axis X, Ra is the distance (radius) of the outer side wall (M) to symmetry axis X and where is valid: Ra>Ri and Ri>0.

In this example, the length of the radius Ri of the inner side wall N is approximately 63% of the radius Ra of the outer radius side wall M.

Figure 6C:
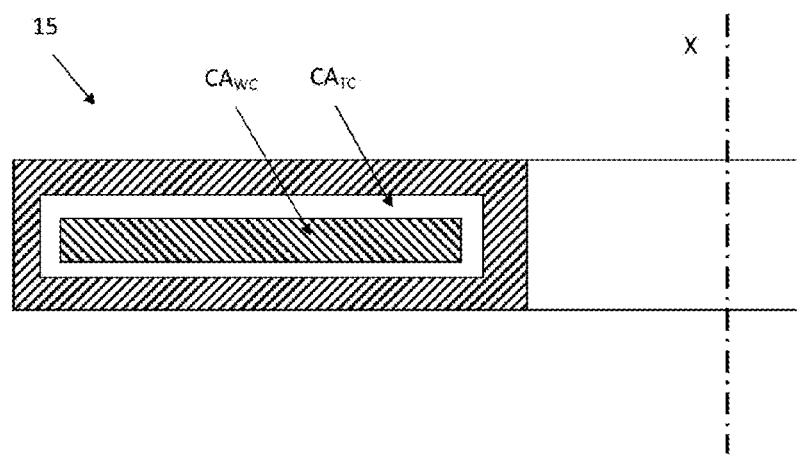
FIG. 6c illustration of the torus shaped vacuum chamber in a cross sectional view.

A vacuum process system where a plurality of process stations is arranged adjacent to walls (K, L, M, N) and where is valid one of the following:
All process chambers are attached to top wall K
All process chambers are attached to bottom wall L
All process chambers are attached to inner side wall N
All process chambers are attached to outer side wall M
All process chambers are distributed between top wall K and bottom wall L
All process chambers are distributed inner side wall N and outer side wall M
All process chambers are distributed between top wall K and bottom wall L and are facing each other
All process chambers are distributed inner side wall N and outer side wall M and are facing each other FIG. 6c shows an illustration of the torus shaped vacuum chamber 15 in a cross sectional view. The inner space of the vacuum chamber 15 has a rectangular radial cross section, which defines a first area $CA_{TC}$ (indicated by the circumference of the enclosed blank area). A rotatable ring plate as workpiece carrier is arranged within the inner space of the vacuum chamber 15. This ring plate is coaxial to the vacuum chamber 15 about an axis X and has a rectangular radial cross section, which defines a second area $CA_{WC}$ (hatched area surrounded by the blank area). In this example, the second area $CA_{WC}$ is more than 70% of the first area $CA_{TC}$. The gaps between the ring plate and the walls of the vacuum chamber 15 are narrow, thus providing for a good limitation of the vacuum conductivity.

Cryogenic Source Isolation

The shape of the transfer chamber already promotes source isolation, i.e. the separation of process chambers. Still, the source isolation cannot be expected to be adequate in all cases. Fortunately, the space between the process stations allows for the implementation of contamination mitigating measures.

The measures to be implemented must minimize the migration of contaminating species like water and organics between process stations (33), but still allow material to be transferred. The most appealing method to realize this is the use of cryogenic panels as shown in FIG. 7, showing schematics of the torus shaped vacuum chamber.

The cryogenic source isolation is realized by placing one or more cryogenically cooled plates parallel (30) to the wafer transfer plane in the material transfer chamber (31). The plate or plates are spaced as close as possible to the material transfer plane without interfering with the mechanics of the material transfer mechanism (31). The plate or plates are designed to show the largest possible horizontal surface area limited by the design limitations within the system or cryogenics temperature performance. A minimal smallest width of about 60 mm and a full coverage of the radial length must be maintained to ensure effectiveness.

Figure 7:
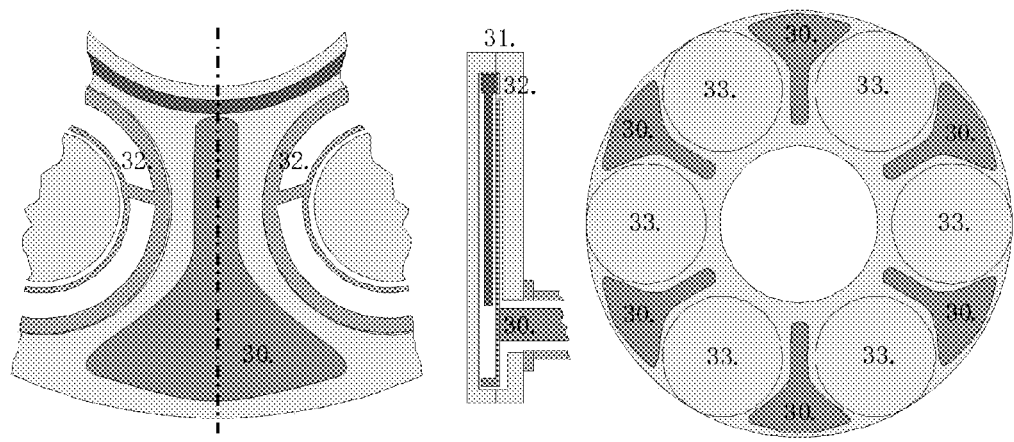
FIG. 7 a detailed view, a side view and a top view of a cryogenic source isolation.

In a preferred embodiment panels 30 can be arranged flush in pockets or recesses foreseen in the upper or lower part of the transfer chamber as shown in FIG. 7 (middle part). Thus cryo pumping power is transferred from process chamber areas to the transfer chamber and will be effective even during processing of substrates in the chambers.

Figure 8:
FIG. 8 a cryogenic source isolation.

This method uses the kinematics of molecular flow pressure ranges. If one or both side of a narrow channel is cooled to temperatures which condense or sublimate the contaminating species, the flow of species moving from one side of this channel to the other is governed by the probability that a traversing molecule misses the cryogenic surfaces or evaporates from these surfaces. Referring to FIG. 8, showing a cryogenic source isolation (ColdGate Model), this probability can be estimated based on the typical dimensions of the narrow channel.

Based on these considerations, cryogenic source isolation can be accomplished by placing cold baffle plates between the process stations while still allowing the flow of substrates between the stations.

These cold baffle plates can be cleaned during maintenance by heating them, thus releasing previously adsorbed gases. Evacuation takes place via pumping means as described above.

This concept resolves some of the outlined shortcomings by;

Actively preventing contaminating species to traverse between process stations to minimize cross-contamination.

Summary:

A vacuum process system for the treatment of substrates comprising a plurality of process chambers and a transfer chamber; wherein, said transfer chamber has a ring or torus shape with said process chambers arranged at the side or top walls of said torus and cooled plates being arranged adjacent to said walls inside said transfer chamber; between said process stations
in a plane parallel to the transport path of the substrates in the transfer chamber
in close relationship to the minimum clearance of a substrate carrier/handling system.

Parallel Time Based of Wafer Position Measurement

In U.S. Pat. No. 7,706,908 a method is described to determine the wafer placement based on the combination of a single laser sensor and the robot control parameters. A similar method can be deployed in an indexer type tool. The implementation is governed by;

Having a clear view on the edge of the material at least two different positions on this material edge in the motion trajectory of the material.
Having the capability to simultaneously determine the edges of all moving substrates.

Of these considerations, the first item is a design feature where the seconds is a control capability.

Figure 9:
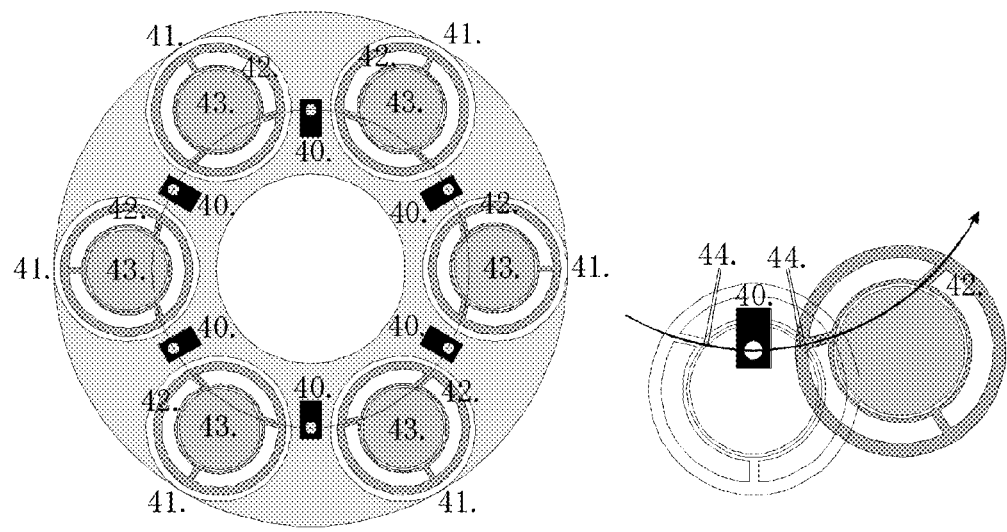
FIG. 9 a top view and a detailed view of a simultaneous OTF position sensing.

FIG. 9, showing a simultaneous OTF position sensing, shows a design implementation of the wafer position measurement. Sensors 40 are placed between the stations 41 in such a way that the sensing laser beam of the sensor is blocked by the moving substrate. The design of the wafer transfer and carrying mechanism 42 is such that clear distinction can be made between the substrate 43 blocking the beam or the mechanism blocking the beam. This is done by establishing a clear sequence of signal changes during the material transfer out of which the material triggered signal changed can be uniquely identified. Since it can be safely assumed that the mechanics of the system are invariant, these signals can be used as reference. The material triggered signals must be assumed to be variable. In the interpreting algorithm, the reference signals are compared with the variable signals to determine two chord lengths 44. If the absolute size and relative difference of these two lengths is within the tolerance boundaries of the equipment, the material position is defined as correct.

The invention claimed is:

1. A vacuum treatment apparatus comprising:
a plurality of treatment chambers (18,19) for treating workpieces,
a transfer chamber (15) being attached to the treatment chambers (18,19) communicating via respective openings with said transfer chamber (15) and comprising handling zones located adjacent to each of the treatment chambers (18,19),
a workpiece carrier arranged within the transfer chamber (15) configured to transfer the workpieces between the handling zones, and
one or more handlers for lifting the workpieces between the handling zones and the treatment chambers (18,19),
wherein the transfer chamber (15) comprises a through hole that provides an open space.

2. The vacuum treatment apparatus according to claim 1, wherein the transfer chamber (15) surrounds an open space and/or has a substantially rectangular cross-section of at least an inner space of extending in radial direction.

3. The vacuum treatment apparatus according to claim 1, wherein the radial width of an inner space of said transfer chamber (15) is equal or larger than the height of said inner space.

4. The apparatus of claim 1, wherein said workpiece carrier comprises a controllably rotatable ring plate or segmented assembly in an inner space of said transfer chamber (15), the area ($CA_{WC}$) of the radial cross section of the workpiece carrier being more than 70% of the area ($CA_{TC}$) of the radial cross section of the inner space of the transfer chamber.

5. The vacuum treatment apparatus according to claim 1, wherein the radial inner and outer side walls (20) of the transfer chamber (15) have an inner radius (Ri) and an outer radius (Ra) respectively and the length of the inner radius (Ri) is at least 25% of the outer radius (Ra).

6. The vacuum treatment apparatus according to claim 1, wherein the workpiece carrier comprises a ring plate, rotatable and held single or both sided by bearings arranged at the radial inner side wall (20;N) and/or at the radial outer side wall (20;M) of the transfer chamber (15).

7. The vacuum treatment apparatus according to claim 1, wherein the surface of an inner wall of at least one of the treatment chambers (18,19) substantially aligns to the surface of the outer side wall (20;M) and/or to the surface of the inner side wall (20,N) of the transfer chamber (15).

8. The vacuum treatment apparatus according to claim 1, said workpiece carrier being configured to move workpieces having at least one substantially planar surface in a direction parallel to said substantially planar surface between positions adjacent to said openings in said handling zones and further comprising workpiece lifts operative in said handling zones configured to move said workpieces in said handling zones from said workpiece carrier towards said openings and inversely.

9. The vacuum treatment apparatus according to claim 1, wherein at least two of the treatment chambers (18,19) are opposing each other.

10. The vacuum treatment apparatus according to claim 1, wherein at least one of the treatment chambers (18,19) is accessible from the adjacent handling zone via said opening comprising a seal arrangement establishing a sealing action controllably by operation of a workpiece lift provided in said handling zone and configured to controllably lift a workpiece from said workpiece carrier towards said opening or inversely, said seal arrangement sealingly separating the inside of said transfer chamber from the inside of said treatment chamber.

11. The apparatus of claim 10 wherein said sealing action is enforced by a pressure difference directed from said treatment chamber to said transfer chamber (15).

12. The vacuum treatment apparatus according to claim 1, wherein the at least one of the treatment chambers comprises a first part (18) configured to perform treatment of the workpieces and a second part (19) configured to establish vacuum conditions, in particular for providing connectivity to a vacuum pump, wherein, one of said first and second parts being arranged on one side of said workpiece carrier, the other of said parts opposite to said one part and on the other side of said workpiece carrier, said two parts being in flow communication at least when a workpiece is in treatment position with respect to said first part.

13. The vacuum treatment apparatus according to claim 1, wherein the transfer chamber (15) comprises at least one cryogenic plate (30) arranged between neighboring handling zones.

14. A vacuum treatment apparatus according to claim 1 wherein the workpieces are silicon wafers.

15. The vacuum treatment apparatus according to claim 1 wherein the radial inner and outer side walls (2) of the transfer chamber (15) have an inner radius (Ri) and an outer radius (Ra) respectively and the length of the inner radius (Ri) is at least 50% of the outer radius (Ra).

16. The vacuum treatment apparatus according to claim 1 wherein the transfer chamber includes an inner wall that extends through the height of the transfer chamber.

17. A method for manufacturing a workpiece, which is treated by a vacuum treatment, comprising:
   a. providing a workpiece transfer chamber (15) which comprises a through hole that provides an open space;
   b. providing a plurality of treatment chambers (18,19), communicating by respective openings with said workpiece transfer chamber (15) via respective openings with opening axes;
   c. providing a ring shaped workpiece carrier in said transfer chamber (15);
   d. providing adjacent at least one of said openings a workpiece lift;
   e. depositing a workpiece on said ring shaped workpiece carrier in said transfer chamber (15);
   f. moving said workpiece carrier with said workpiece in a position where said workpiece is aligned with said one opening;
   g. lifting said workpiece by said workpiece lift towards said one opening;
   h. vacuum treating said workpiece by said treatment chamber (18,19);
   i. retracting said treated workpiece on said workpiece carrier;
   j. moving said workpiece carrier with said workpiece to a position where said workpiece is aligned with a further of said treatment chambers (18,19);
   k. repeating steps h. to j. up to said workpiece having been treated by predetermined ones of said treatment chambers (18,19) and;
   l. removing said treated workpiece from said workpiece carrier.

18. The method of claim 17 comprising providing a pumping facility to at least one of said treatment chambers (18,19) and evacuating said transfer chamber (15) at least predominantly by said pumping facility.

19. The method of claim 17 further sealingly separating said treatment chamber (18,19) from said transfer chamber (15) at least during step h.

20. A vacuum treatment apparatus comprising:
   a plurality of treatment chambers (18,19) for treating workpieces,
   a transfer chamber (15) being attached to the treatment chambers (18,19) communicating via respective openings with said transfer chamber (15) and comprising handling zones located adjacent to each of the treatment chambers (18,19),
   a workpiece carrier arranged within the transfer chamber (15) configured to transfer the workpieces between the handling zones, and
   one or more handlers for lifting the workpieces between the handling zones and the treatment chambers (18,19),
   wherein the transfer chamber (15) is torus-shaped about an axis (X) and said openings have opening axes substantially parallel to said axis (X) comprises a through hole that provides an open space.

21. A method for manufacturing a workpiece, which is treated by a vacuum treatment, comprising:
   a. providing a workpiece transfer chamber (15) which is torus-shaped about an axis (X) comprises a through hole that provides an open space;
   b. providing a plurality of treatment chambers (18,19), communicating by respective openings with said workpiece transfer chamber (15) via respective openings with opening axes substantially parallel to said axis (X);
   c. providing a ring shaped workpiece carrier in said torus-shaped transfer chamber (15);
   d. providing adjacent at least one of said openings a workpiece lift;
   e. depositing a workpiece on said ring shaped workpiece carrier in said transfer chamber (15);
   f. moving said workpiece carrier with said workpiece in a position where said workpiece is aligned with said one opening;
   g. lifting said workpiece by said workpiece lift towards said one opening;
   h. vacuum treating said workpiece by said treatment chamber (18,19);
   i. retracting said treated workpiece on said workpiece carrier;
   j. moving said workpiece carrier with said workpiece to a position where said workpiece is aligned with a further of said treatment chambers (18,19);
   k. repeating steps h. to j. up to said workpiece having been treated by predetermined ones of said treatment chambers (18,19) and;
   l. removing said treated workpiece from said workpiece carrier.

* * * * *